United States Patent [19]
Possin et al.

[11] Patent Number: 5,527,726
[45] Date of Patent: Jun. 18, 1996

[54] SELF-ALIGNED THIN-FILM TRANSISTOR CONSTRUCTED USING LIFT-OFF TECHNIQUE

[75] Inventors: George E. Possin; Robert F. Kwasnick, both of Schenectady, N.Y.

[73] Assignee: General Electric Company, Schenectady, N.Y.

[21] Appl. No.: 425,269

[22] Filed: Apr. 17, 1995

Related U.S. Application Data

[63] Continuation of Ser. No. 24,050, Mar. 1, 1993, abandoned.
[51] Int. Cl.$^6$ .................................................. H01L 21/265
[52] U.S. Cl. .............................. 437/41; 437/40; 437/924; 437/944; 148/DIG. 100; 148/DIG. 102; 148/DIG. 105
[58] Field of Search ............................... 437/40, 41, 924, 437/944; 148/DIG. 100, DIG. 102, DIG. 105

[56] References Cited

U.S. PATENT DOCUMENTS

| | | | |
|---|---|---|---|
| 4,670,097 | 6/1987 | Abdalla et al. | 156/650 |
| 4,700,458 | 10/1987 | Suzuki et al. | 437/41 |
| 4,778,773 | 10/1988 | Sukegawa | 437/41 |
| 4,788,157 | 11/1988 | Nakamura | 437/046 |
| 5,010,027 | 4/1991 | Possin et al. | 437/41 |

FOREIGN PATENT DOCUMENTS

| | | |
|---|---|---|
| 453169A2 | 10/1991 | European Pat. Off. . |
| 2590406 | 5/1987 | France . |
| 0008570 | 1/1987 | Japan . |
| 62-260369 | 11/1987 | Japan . |
| 63-168052 | 7/1988 | Japan . |
| 2288237 | 11/1990 | Japan . |
| 0201537 | 9/1991 | Japan . |
| 4002135 | 1/1992 | Japan . |

OTHER PUBLICATIONS

Busta et al., "Self–Aligned Bottom–Gate Submicrometer–channel length a–Si:H Thin–Film Transistors", IEEE Trans. on Electron Devices, vol. 36, No. 12, Dec. 1989, pp. 2883–2888.

K. Asama et al., "A Self–Alignment Processed a–Si TFT Matrix Circuit for LCD Panels", Fujitsu Laboratories, Ltd. Atsugi, Japan, SID Digest, 1983, pp. 144–145.

B. Diem et al. "a–Si:H TFT: Potential Suitabilities for Gate and Source–Drain Self–Aligned Structure", Mat. Res. Soc. Symp. Proc., vol. 33 (1984), pp. 281–285.

*Primary Examiner*—Trung Dang
*Attorney, Agent, or Firm*—Marvin Snyder

[57] ABSTRACT

A thin-film field-effect transistor is fabricated by forming an electrically insulative island between the source and the drain. A cap is formed on the island with a brim that overhangs the island. A layer of source-drain metal, which will subsequently constitute the source and drain contacts, is then deposited upon the source, the drain, and the cap, but the overhang creates an exposed region which can be attacked by an etchant. When the etchant is applied, it etches away the cap, thereby lifting off the source-drain metal which coated the cap, leaving the fully formed source and drain contacts separated by the island.

1 Claim, 11 Drawing Sheets

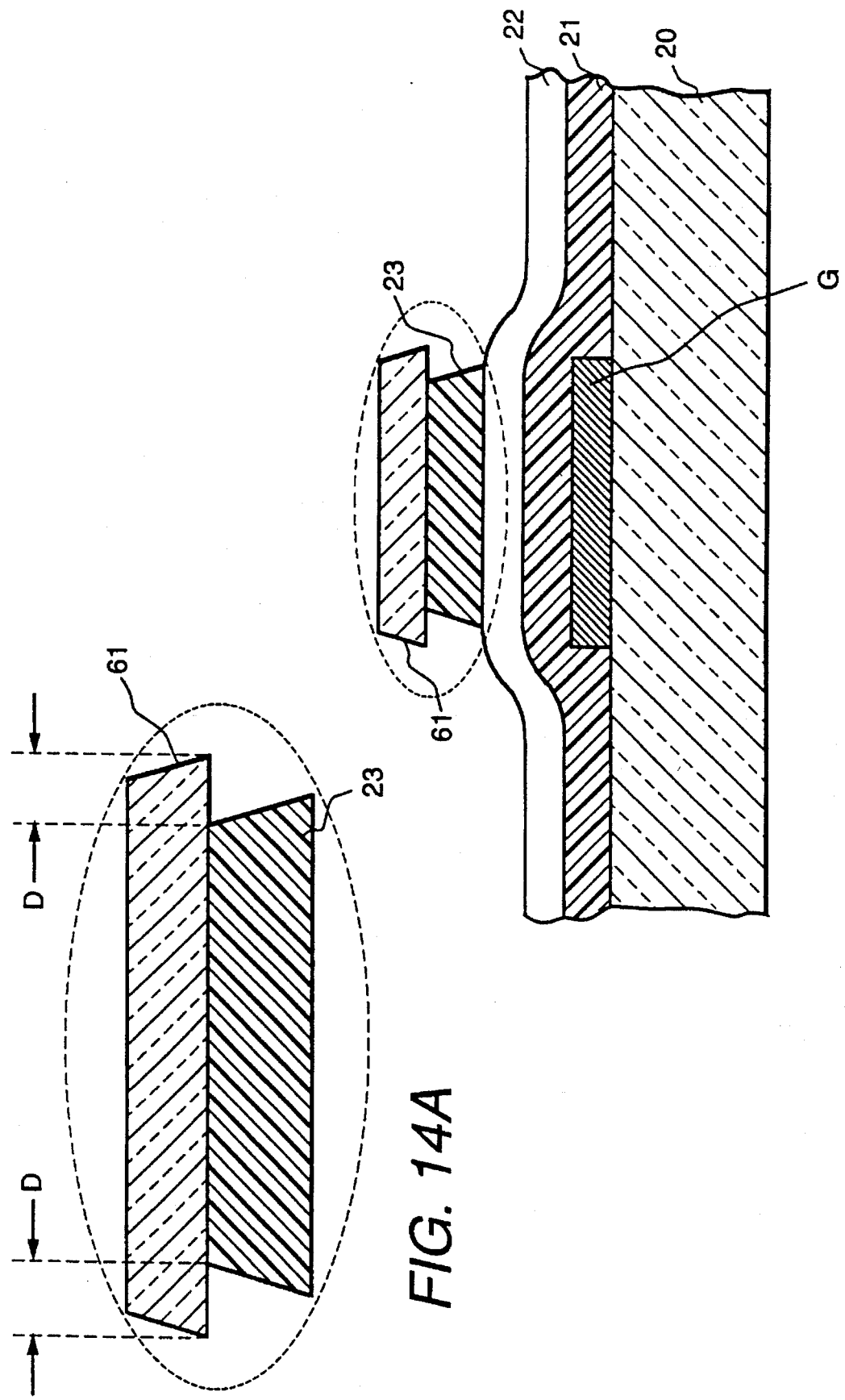

SELF-ALIGNED THIN-FILM TRANSISTOR CONSTRUCTED USING LIFT-OFF TECHNIQUE

This application is a Continuation of application Ser. No. 08/024,050, filed Mar. 1, 1993 now abandoned.

This invention relates to the manufacture of thin-film field-effect transistors and, in particular, concerns a process for patterning the source-drain contacts in such transistors.

BACKGROUND OF THE INVENTION

In some types of imaging and display devices, a thin-film field-effect transistor (TFT) is associated with each pixel. The TFT must be small for several reasons. One, it consumes space within the pixel, which would otherwise be devoted to light collection or light control. Two, the TFT must be small because the pixels themselves are small; over one million pixels may be constructed on a plate measuring 8×8 inches. Three, the TFT must be small to minimize (a) the total gate capacitance, (b) the gate-to-source capacitance, and (c) the gate-to-drain capacitance.

The total gate capacitance should be small in order to reduce the total capacitance of the address line (i.e., scan line) which controls a row of TFTs in the imaging or display device. The charging time of this address line is controlled by the product of the line resistance and line capacitance. The total gate capacitance is added to the line capacitance in determining the address line charging time.

The drain-to-gate and source-to-gate capacitances should be small to minimize the coupling capacitance between the input address line, which is connected to the gate, and the imaging or display element connected to the source or drain.

PRIOR ART

In pursuit of reduced capacitances, the gate-to-drain and gate-to-source overlaps in the TFT should be kept minimal. However, it can be difficult to manufacture small TFTs in which the overlap is exactly a desired amount. One reason is that a photolithographic process is commonly used to form the source and drain. In such process, there is a typical positioning misalignment of about 2 microns or more which must be accounted for in the device layout. This amount of misalignment requires that the regions where the gate overlaps the source and drain be made larger than otherwise required, to allow for this misalignment. These enlarged sizes increase the capacitances discussed above, which is undesirable.

One approach to reducing this misalignment is found in commonly-assigned G. Possin et al. U.S. Pat. No. 5,010,027, issued Apr. 23, 1991. This patent, which discusses a self-alignment technique for constructing thin-film transistors, is hereby incorporated by reference.

OBJECTS OF THE INVENTION

One object of the invention is to provide improvements in alignment of the source and drain contacts in the manufacture of thin-film transistors.

Another object of the invention is to provide a thin-film transistor of reduced size.

SUMMARY OF THE INVENTION

Briefly, in accordance with a preferred embodiment of the invention, during construction of a thin-film field-effect transistor, a cap is positioned over the channel region, between the source and drain. A coating of source-drain material, which will form the source and drain contacts, is then applied over the source and drain regions, and the cap. One type of source-drain material is a layer of metal over a layer of semiconductor, such as N+ silicon. An etchant is thereafter applied, which etches away the cap, causing the source-drain materials coated on the cap to lift away, leaving the source and drain contacts in place.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

FIGS. 8–14 illustrate in more detail the construction of one form of the invention;

FIG. 14A is an enlarged view of a portion of FIG. 14;

DETAILED DESCRIPTION OF THE INVENTION

Figure 1:
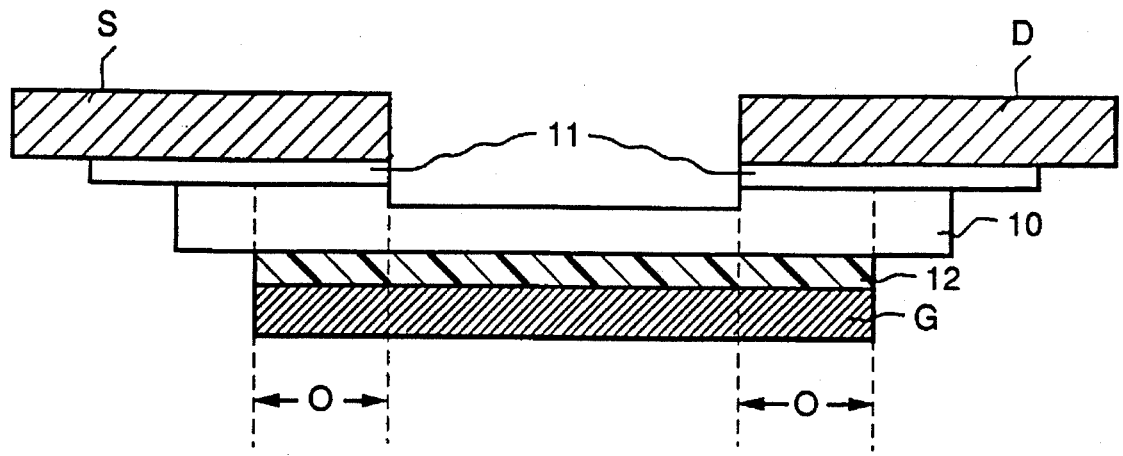
FIG. 1 is a schematic illustration of a field-effect transistor.

FIG. 1 illustrates a TFT of a type known in the art, showing an overlap O between the gate electrode G and each of the source S and drain D electrodes or contacts. The metallic source and drain electrodes are attached to the transistor semiconductor substrate 10, typically of silicon, through a thin N+ silicon layer 11. The metallic gate electrode is spaced from substrate 10 by a layer of insulation 12. The channel region exists in substrate 10 above gate electrode G, primarily in the region not overlapped by drain and source electrodes D and S, respectively.

In pursuit of reduced capacitances, this overlap should be kept small. However, manufacture of small TFTs in which the overlap is exactly a desired amount is known to be difficult due, at least in part, to the typical positioning misalignment of about 2 microns or more resulting from the photolithographic process commonly used to form the source and drain contacts. This positioning misalignment requires that the regions where the gate electrode overlaps the source and drain contacts be made larger than otherwise necessary, to allow for the misalignment, resulting in the undesirable increases in the capacitances as discussed above.

Simplified Form of the Invention

Figure 2:
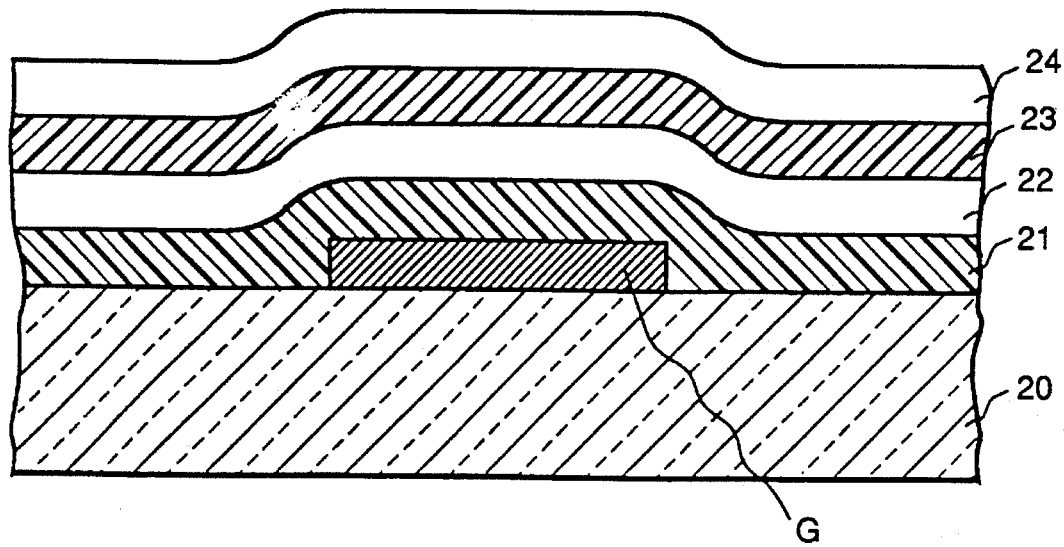
FIGS. 2–5 illustrate a sequence of steps used in constructing one form of the invention.

FIG. 2 shows a starting structure, which can be constructed using known techniques. The substrate-carrier 20 may be comprised of glass; however, other materials may be substituted therefor, providing they are sufficiently transparent to ultraviolet light in the 400 nanometer (nm) range. The gate electrode G is deposited on substrate-carrier 20, as by sputtering, and gate electrode G and substrate-carrier 20 are overlaid, in sequence, by a layer of insulation 21, a layer of silicon 22, a second layer of insulation 23, and cap material 24, which may comprise, for example, molybdenum or indium tin oxide sufficiently thin to be transparent or semi-transparent to actinic light. Layers 21, 22, 23 and 24 may be deposited by any of several conventional techniques such as plasma-enhanced chemical vapor deposition, while the cap layer may be applied by sputtering for example.

Figure 3:
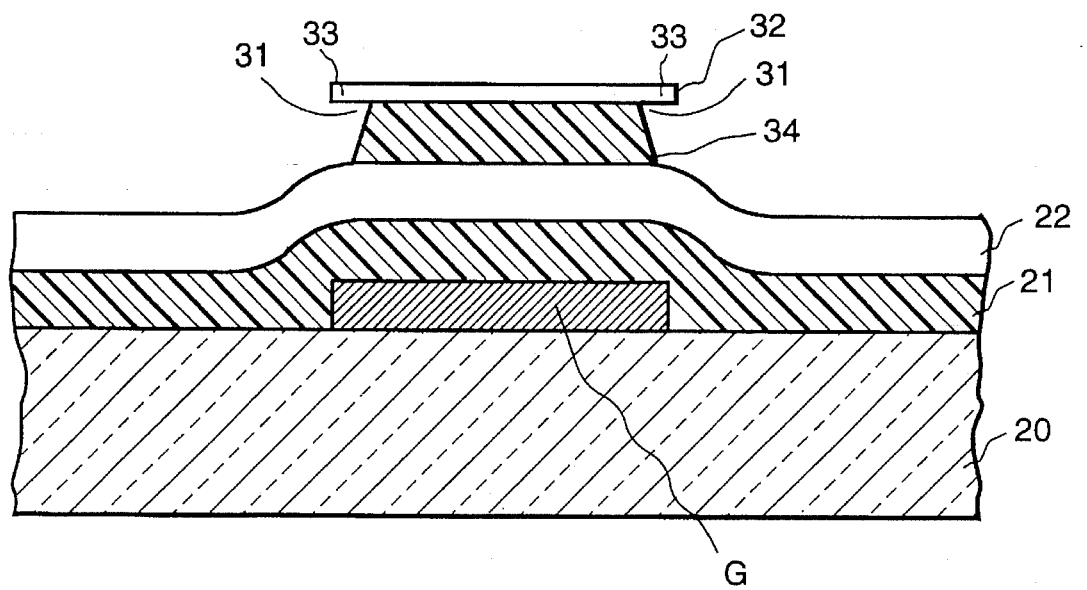

An island 34 is constructed from cap material 24, as shown in FIG. 3. The island is centered on the gate between the source and drain regions by use of a self-alignment technique, such as described in the aforementioned U.S. Pat. No. 5,010,027, in its formation. A cap 32 having a brim 33 is then formed on the island. The brim prevents material, deposited in the next step, from accumulating in region 31 beneath the outer portion of the brim.

Figure 4:
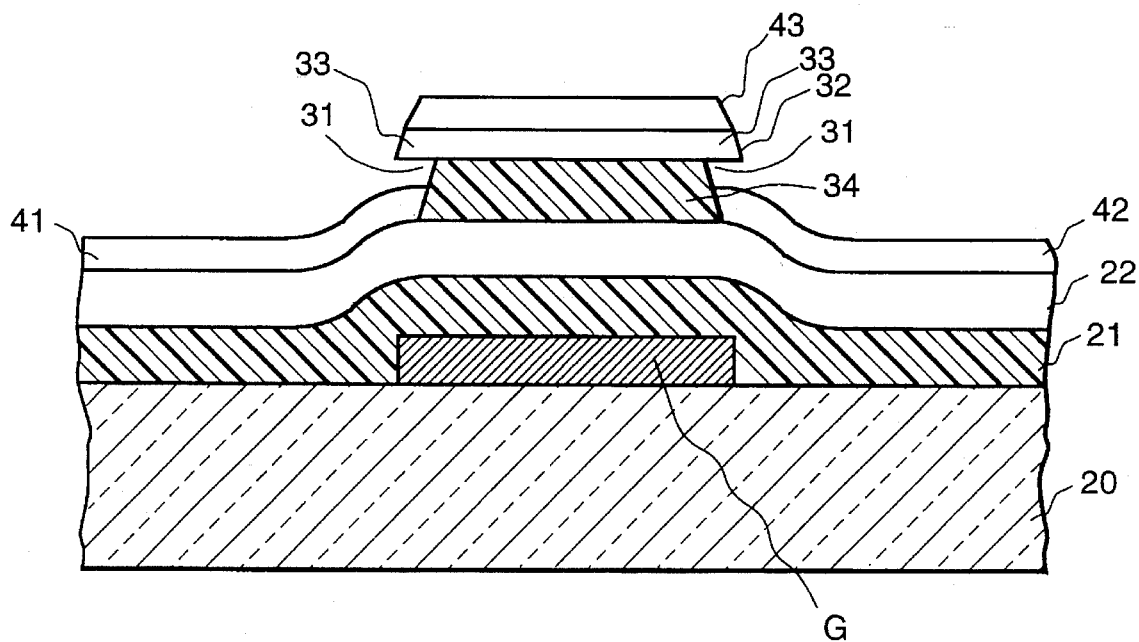
Figure 5:
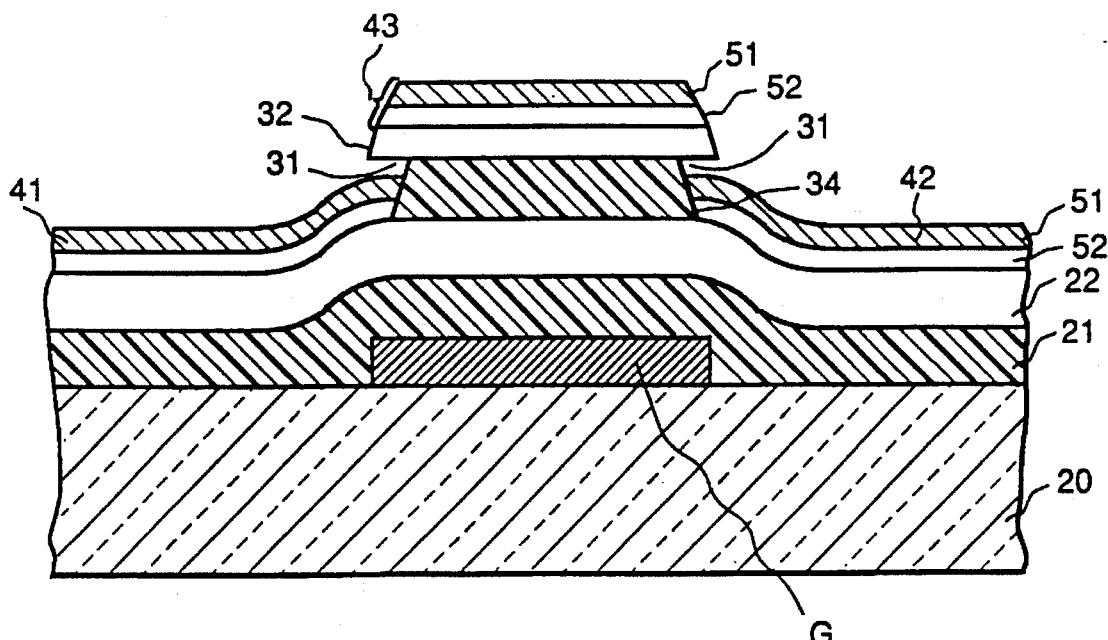

As the next step, the conductive source and drain contacts 41 and 42, respectively, are formed, as shown in FIG. 4. Although these contacts are shown as single layers, in practice they can be constructed of two layers 51 and 52 as shown in FIG. 5, wherein they comprise source-drain (SD) metal and n+ silicon, respectively. During this step, the material forming source and drain layers 41 and 42, respectively, also accumulates as unwanted material 43 upon cap 32 as shown in FIGS. 4 and 5. However, brim 33 reduces or eliminates accumulation of source and drain material in region 31.

Figure 6:
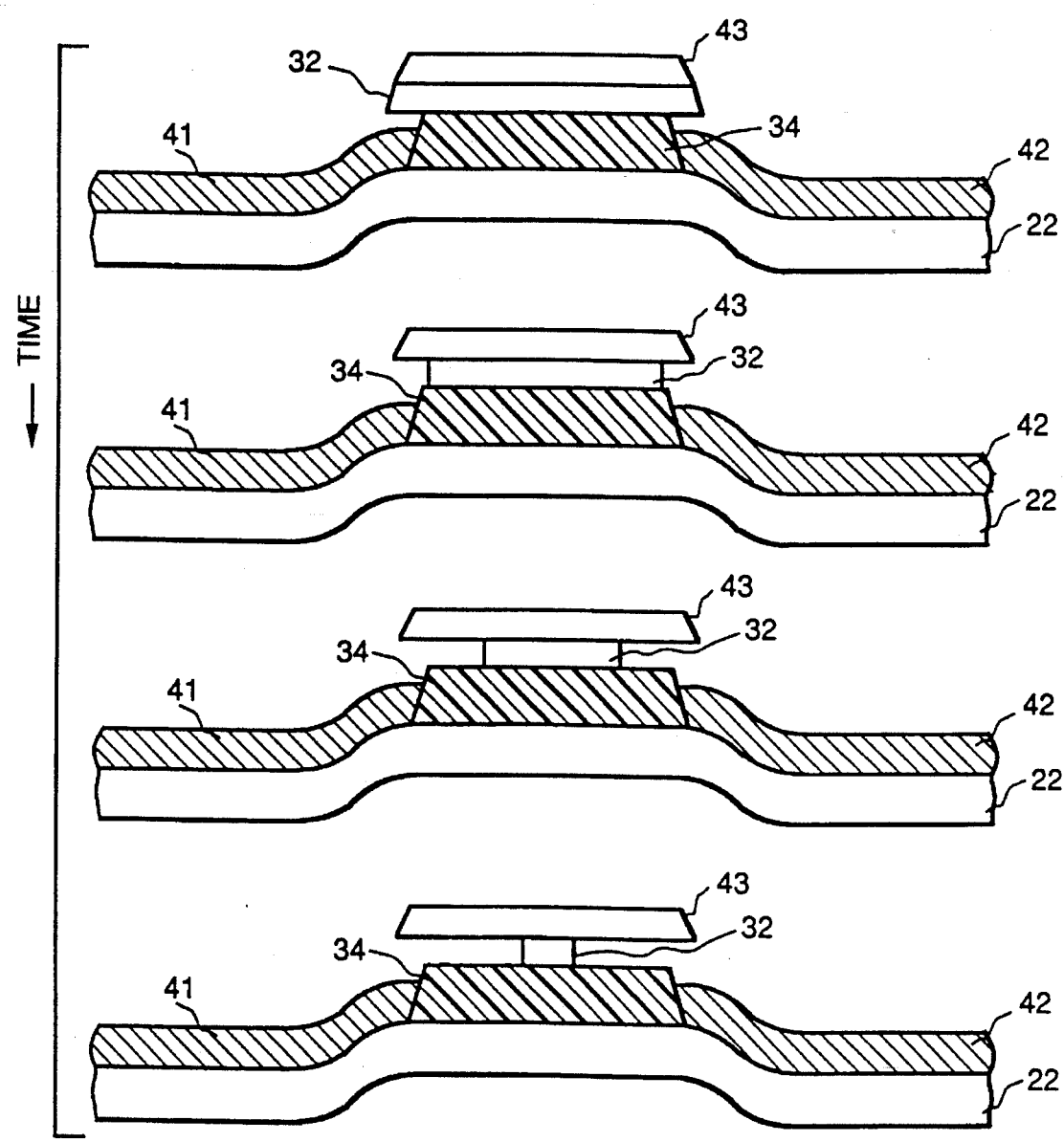

The entire structure shown in FIG. 4 is next subjected to an etch, which attacks cap 32 at its exposed portion in region 31. However, the etch does not damage the other structures, such as source and drain contacts 41 and 42, respectively, or island 32. The cap etches away, as indicated by the sequence of FIG. 6, and eventually lifts off, as indicated by the arrows and phantom lines shown in FIG. 7, leaving an overlap O between the gate electrode and each of the source and drain contacts. No masking and patterning operation, as done in photolithography, is required to remove the unwanted material 43 which accumulated upon the cap.

More Detailed Explanation of the Invention

Figure 8:
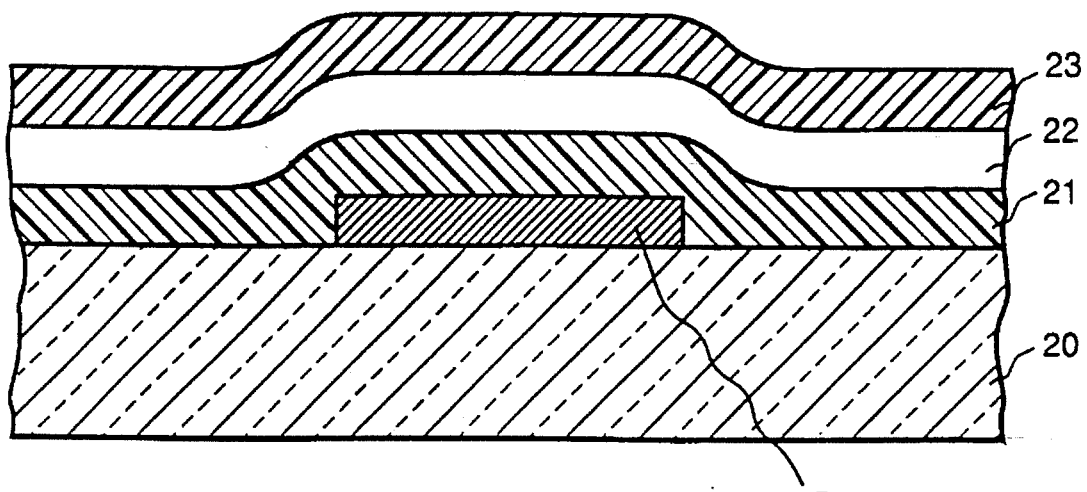
Figure 9:
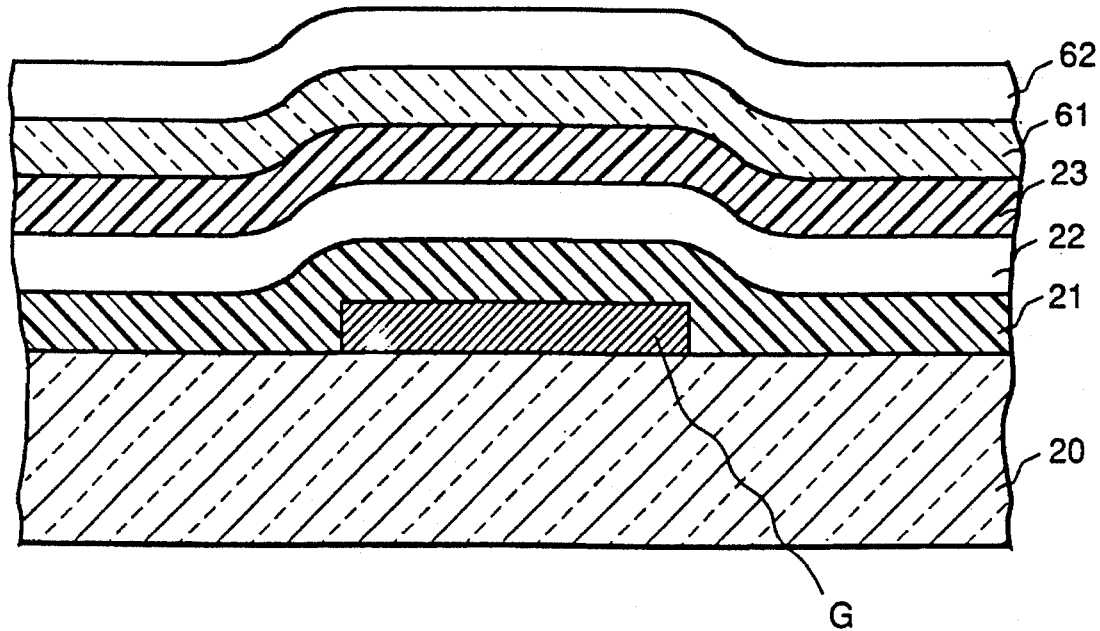

The starting structure is shown in FIG. 8 and is built up by conventional techniques as previously described. In FIG. 9, a layer 61 of material that may be either semi-transparent or transparent is deposited, followed by a layer 62 of photoresist. Lift-off layer 61 may comprise a thin metal, such as molybdenum, or indium tin oxide (ITO), and is transmissive in the near ultraviolet, i.e., in the 400 nanometer range.

Figure 10:
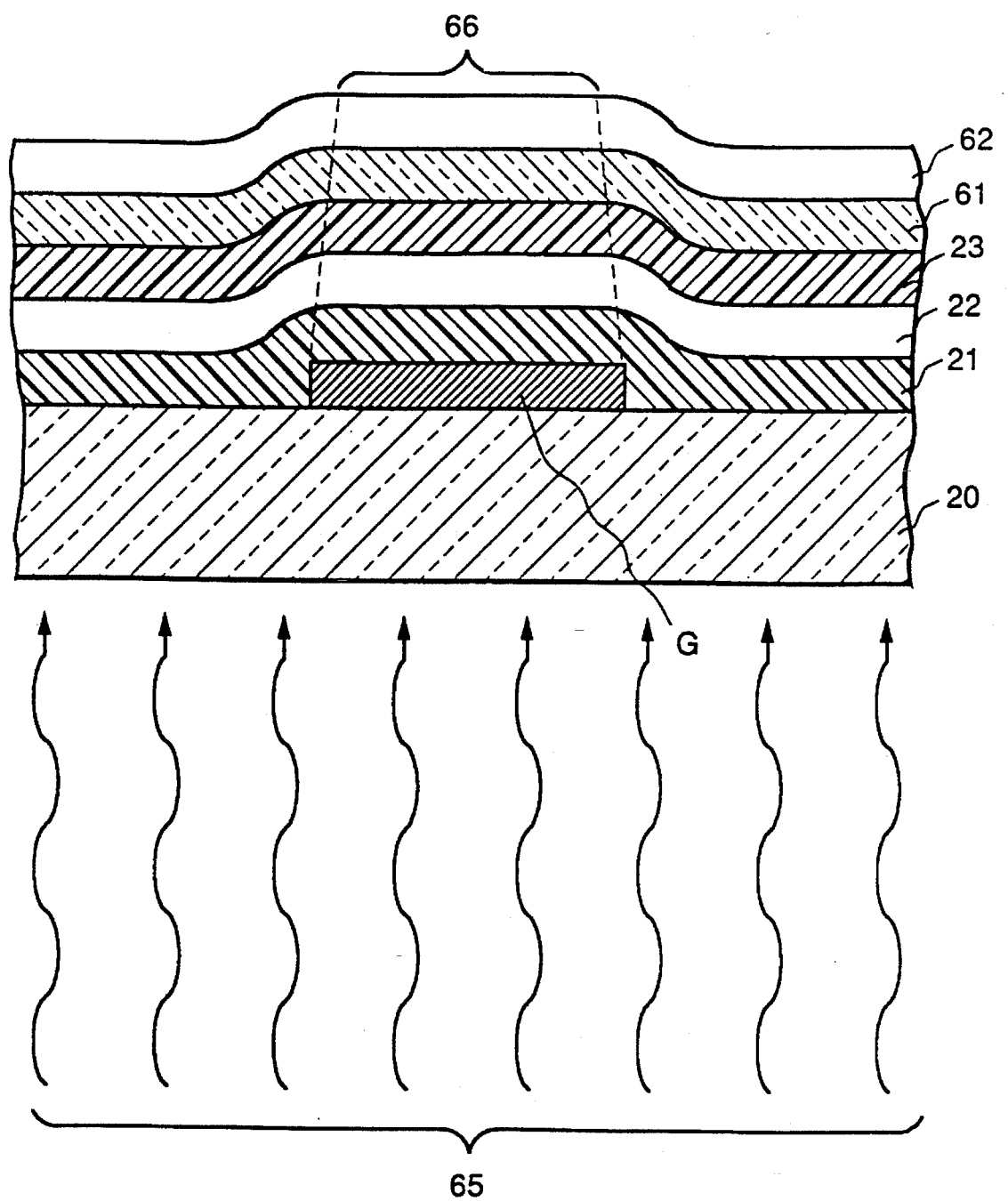

The photoresist of layer 62 is exposed to near ultraviolet light 69, as indicated in FIG. 10, such that gate G casts a shadow 66 upon photoresist layer 62 within the region bounded by dashed lines. The photoresist of layer 62 is then developed so as to remove the exposed portion of photoresist layer 62, but not the portion of photoresist layer 62 shadowed by gate G, resulting in the structure of FIG. 11. The shadowed portion has at this juncture become a photoresist pattern.

Photoresist Shadowed by Gate Defines Shape of Thin Metal

Figure 11:
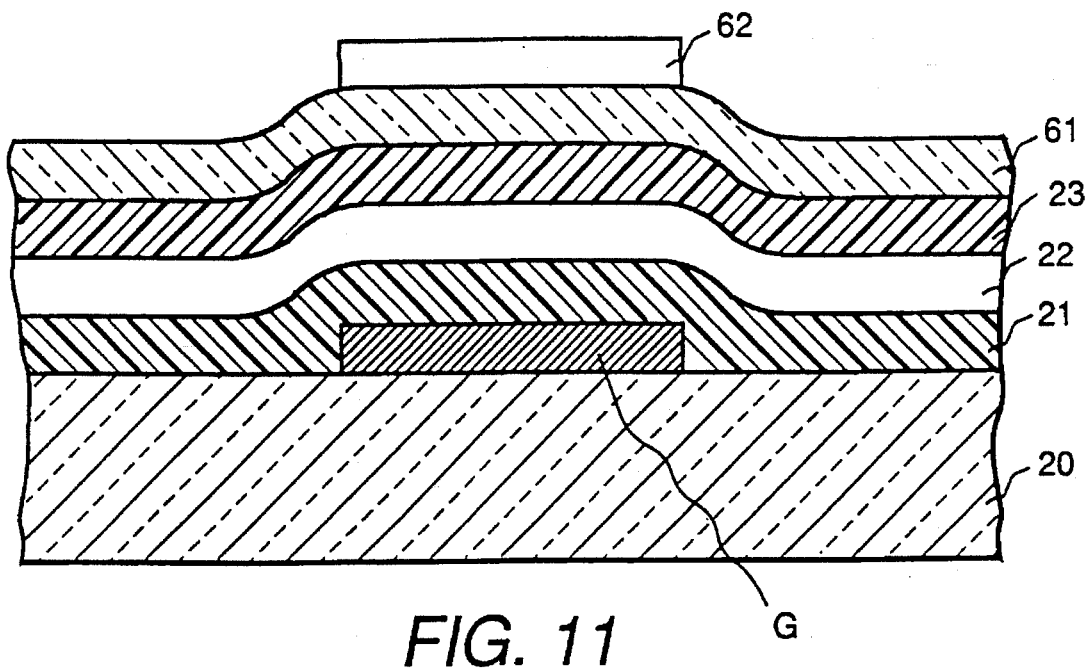
Figure 12:
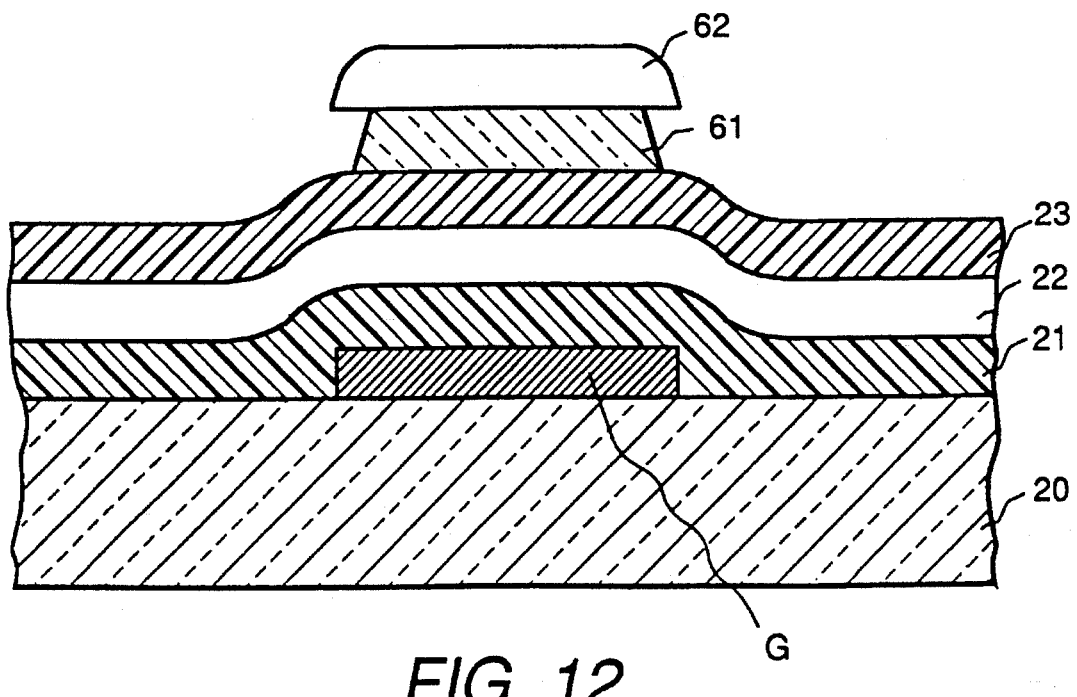

An etchant is applied to the structure of FIG. 11, which etches away lift-off layer 61 except where it is covered by the now-patterned photoresist 62, resulting in the structure shown in FIG. 12.

Figure 13:
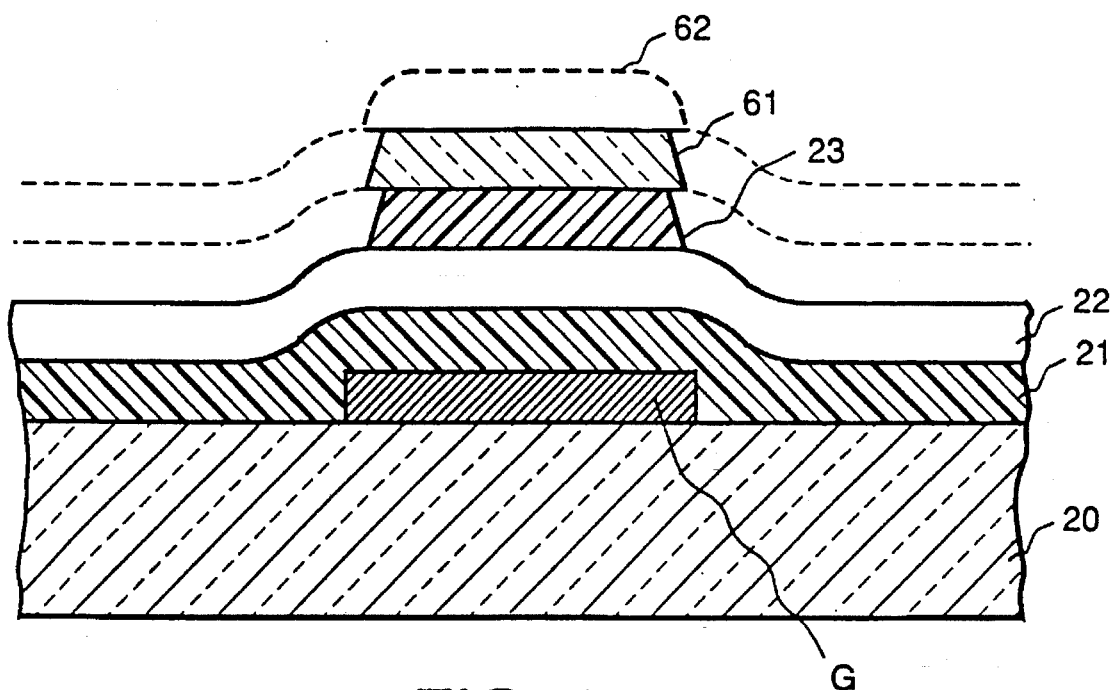

Next, silicon nitride layer 23 is etched away, producing the structure shown in FIG. 13. This etching of layer 23 can be achieved by a wet etch of hydrofluoric acid or buffered hydrofluoric acid. Alternatively, a dry etch, e.g., reactive ion etching with $CHF_3$ and $CO_2$ gases, can be used to preferentially attack the silicon nitride but leave the amorphous silicon largely intact. (Photoresist 62, shown in phantom, can be removed either before or after this step.) The resulting structure is shown in FIG. 14, and FIG. 14A shows, in greater detail, the amount D by which lift-off layer (or cap) 61 overhangs silicon nitride island 23.

Deposition of SD Metal

Figure 15:
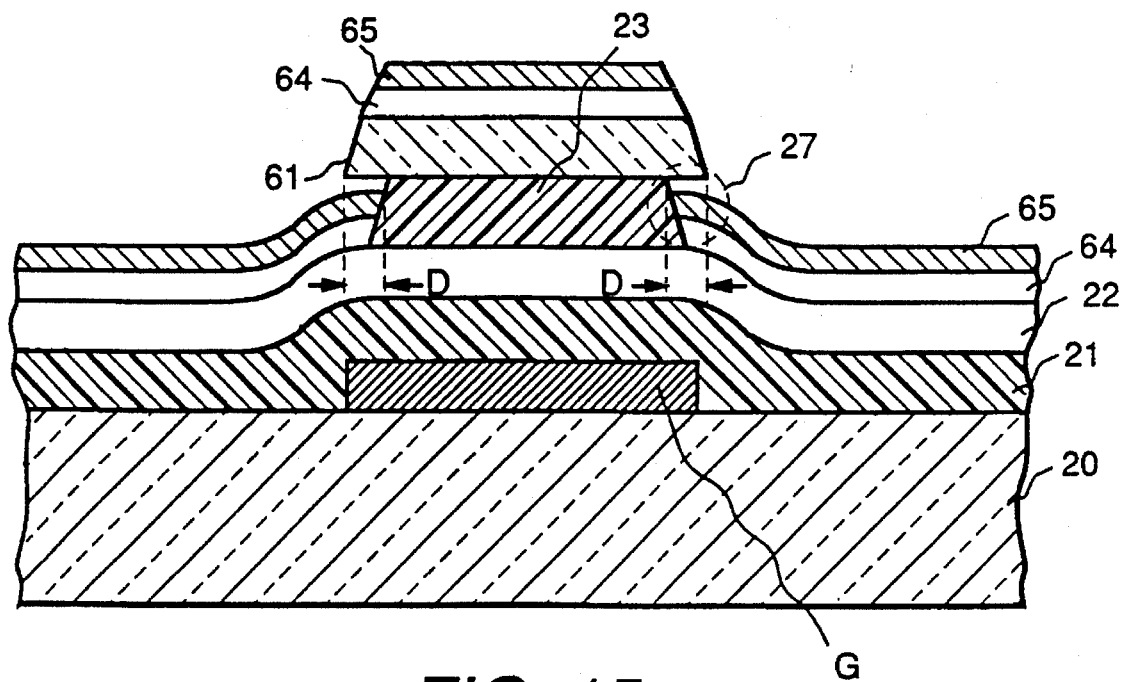
FIG. 15 illustrates an intermediate structure showing in detail a cap, a brim, and an island.

At this juncture, an N+ amorphous silicon (N+ microcrystalline silicon) layer 64 is deposited, resulting in the structure shown in FIG. 15. Silicon layer 64 is about 10 to 100 nanometers (nm) thick and forms a contact region which borders silicon nitride island 23. A layer of SD metal 65, about 10 to 200 nm thick, is next applied, typically by sputtering or evaporation.

Because the brim of the lift-off layer or cap 61 acts as an overhang, region 27 is not significantly covered by layers 64 and 65; instead, the two layers deposit onto the top of cap 61 and onto amorphous silicon layer 22, but are interrupted by a discontinuity in the two layers.

It is not necessary that the brim completely inhibit all deposition of these last two layers in region 27. If the two layers are deposited very thinly in region 27, the etching step which lifts off the cap can still succeed.

Preferably, the discontinuity in layers 64 and 65 causes the portions of these two layers atop cap 61 to be electrically disconnected from the SD metal which is located on amorphous silicon layer 22. This discontinuity allows lift-off layer 61 to be attacked by etchant.

Figure 7:
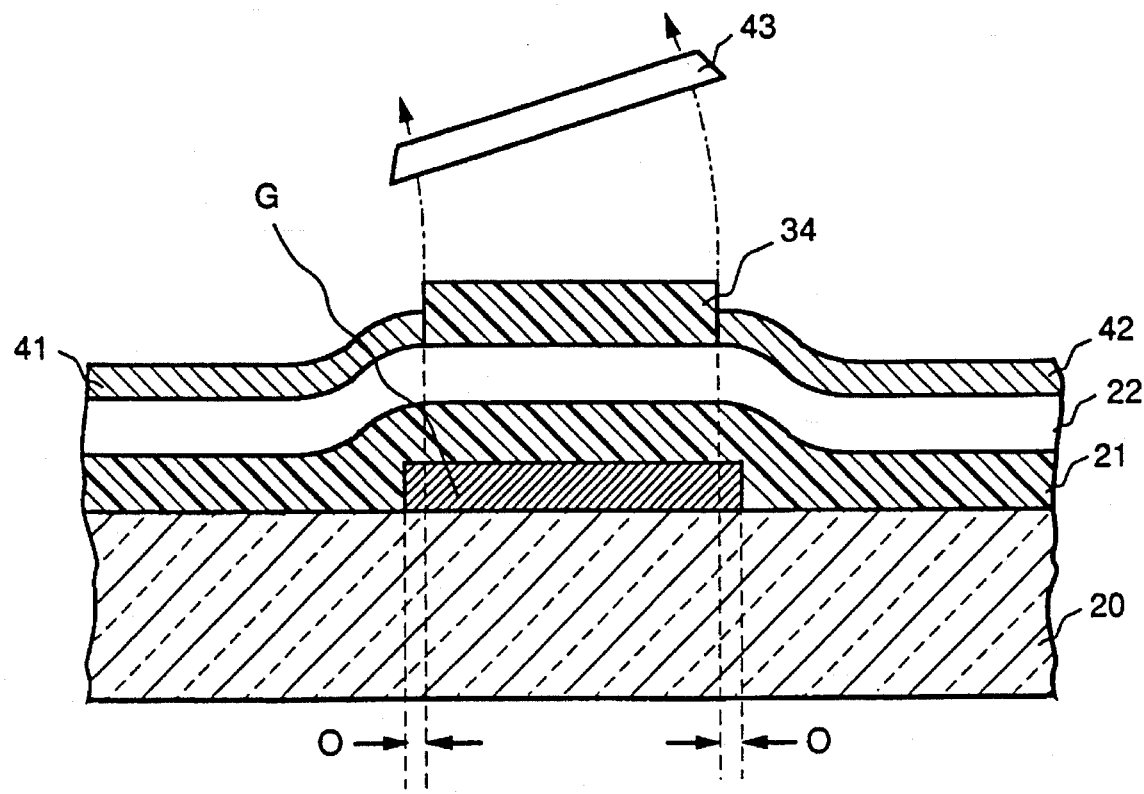
FIGS. 6 and 7 schematically illustrate a lift-off procedure used in the invention.
Figure 16:
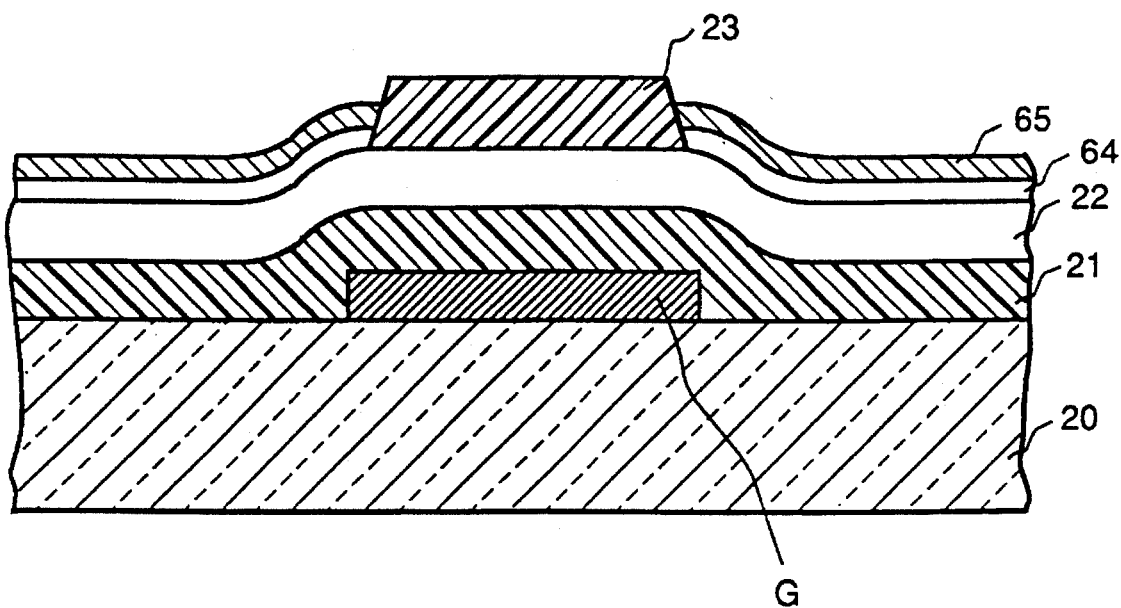
FIG. 16 illustrates an intermediate structure used in another form of the invention.

Lift-off layer 61 is next etched away, causing the two-layer film (layers 64 and 65) coating it to lift off, in the manner shown in FIGS. 6 and 7. The resulting structure, shown in FIG. 16, is a precursor to the final TFT, and can be processed in known fashion to produce the TFT. The aforementioned U.S. Pat. No. 5,010,027 provides details on one such type of further processing.

Embodiments

Indium tin oxide can be used as the lift-off layer 61, and molybdenum can be used as the source-drain (SD) metal 65. Candidates which are possible substitutes for indium tin oxide as the lift-off layer are tungsten, tantalum, aluminum, and zinc oxide. Etchants which will selectively etch the proper layers are known in the art. Alternatively, molybdenum can be used as the lift-off layer, and chromium can be used as the SD metal; or chromium can be used as the lift-off layer, with molybdenum as the SD metal.

Figure 17:
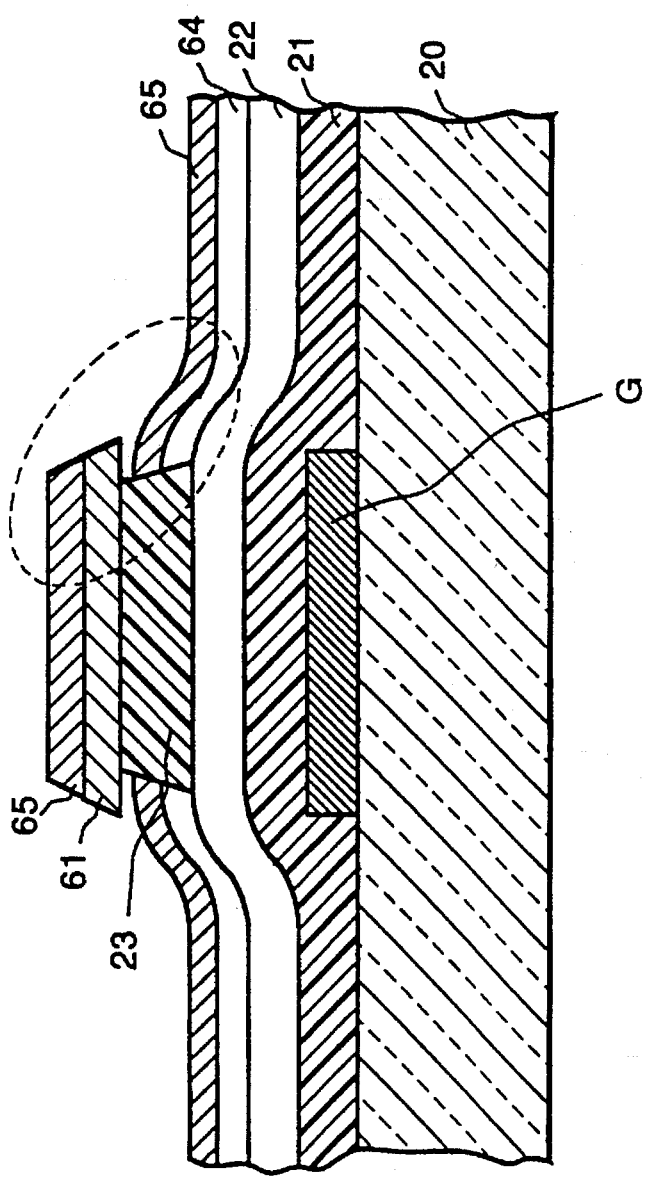
FIG. 17 illustrates processing steps used in another form of the invention.
Figure 17B:
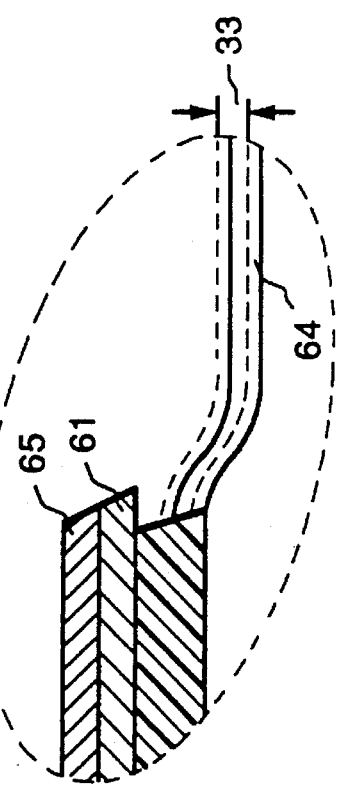
FIG. 17B is a view similar to that of FIG. 17A, after further processing.
Figure 17A:
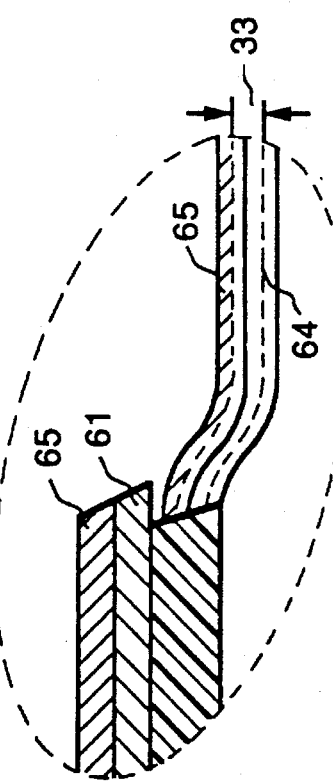
FIG. 17A is an enlarged view of a portion of FIG. 17.

Use of molybdenum as lift-off layer 61 and chromium as SD metal 65 is shown in FIG. 17. One advantage to this combination is that the chromium can be reacted with the underlying N+ silicon layer 64 to form a silicide layer 33 schematically shown in FIG. 17A, which is an enlarged view of the encircled region of FIG. 17. The unreacted chromium can be etched away, leaving silicide layer 33, as indicated in FIG. 17B, which is a view of the region shown after the chromium has been etched away. (Known etchants will selectively etch chromium layer 65 and leave the silicide.)

As a result of using this combination, moreover, etching away of molybdenum lift-off layer 61 is simpler, because the amount of chromium on top of it has been reduced by the chromium etch.

As another alternative, SD metal 65 and N+ silicon layer 64 can be replaced by a single N+ microcrystalline silicon layer to form the source and drain contacts. Selectively etching away the lift-off layer while leaving the microcrystalline silicon is a known procedure. N+ microcrystalline silicon has the advantage of a much higher electrical conductivity than amorphous silicon, and thus a separate source-drain metal is not required.

Additional Considerations

Although molybdenum has been identified as a candidate material for the lift-off layer, other metals can alternatively be used. The metal used must be subject to etch but, at the same time, the etchant must not destroy the SD metal 65 shown in FIG. 15.

As stated above, an alternative combination is chromium for the lift-off layer and molybdenum for the SD metal. Hydrochloric acid can be used as the etchant and it will not significantly attack the molybdenum. Other SD metals which may be used are tungsten, tantalum, gold, nickel-chrome alloys, and aluminum.

In general, an etchant must be available which etches the lift-off layer, yet does not destroy the SD metal, nor the passivation dielectric (i.e., the silicon nitride island 23 in FIG. 15), nor the amorphous silicon (shown in FIG. 15).

Two important features of this process are the following. First, material forming the source and drain contacts does not envelop the cap, but leaves the underside of the brim exposed. (If the brim of the cap were nonexistent, or very small, envelopment would occur. ) Second, the material which accumulates in a layer upon the cap is delaminated from the silicon nitride island by applying the appropriate etchants. The etchants attack the cap as indicated by the schematic sequence of FIGS. 17, 17A and 17B.

As stated above, the semi-transparent material which acts as lift-off layer 61 in FIG. 9, for example, should be transmissive at 400 nanometers (nm). If the lift-off layer is a metal (such as molybdenum, for example), then it must be thin enough to transmit sufficient light to expose photoresist 62, shown in FIG. 9, in an acceptable length of time. Limitations on the thickness of the lift-off layer can be determined in the following manner, using molybdenum as an example.

Measurements of thin sputtered films of molybdenum indicate that the absorption coefficient is about $1.6 \times 10^6$ $cm^{-1}$, for light of 400 nanometers wavelength. From these measurements, a 25 nm film of molybdenum is estimated to have an attenuation factor of about 330; that is, if light passes through the film, light intensity at the exit point would be about 1/330 of the light intensity at the entry point.

A comparison with a self-alignment procedure used in the prior art is appropriate. In the prior art procedure, photoresist is exposed by light which passes through a layer of amorphous silicon (instead of a metal). For a layer of about 25 nm thickness, attenuation is approximately a factor of 10, meaning that the exiting light intensity is about 1/10 of the incoming light intensity.

Thus, by using such molybdenum lift-off layer, the required exposure time has been increased from about 30 seconds (for amorphous silicon) to about one hour. Although this is longer than for amorphous silicon, it is not unreasonable. If the lift-off layer is comprised of indium tin oxide, the exposure time remains about the same as for amorphous silicon.

The layers in the starting structure shown in FIG. 8 preferably have the following thicknesses:

lowermost silicon nitride layer 21 is about 50–500 nm thick;

amorphous silicon layer 22 is about 20–100 nm thick;

upper silicon nitride layer 23 is about 100–1000 nm thick.

Those skilled in the art will appreciate that the channel of the TFT need not be amorphous silicon, but that other semiconductor materials can be used.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. In the manufacture of a field-effect transistor, the improvement comprising the steps of:

a) providing a gate electrode on a carrier which is transmissive to light in the near ultraviolet spectrum;

b) applying a layer of insulator over the gate electrode;

c) applying a layer of amorphous silicon over the layer of insulator;

d) applying a layer of dielectric over the layer of amorphous silicon;

e) applying a lift-off layer of molybdenum to a thickness of about 25 to 300 nanometers over the layer of dielectric, said lift-off layer being transmissive to light in the near ultraviolet spectrum;

f) applying a layer of photoresist over the lift-off layer;

g) exposing the photoresist by projecting light in the near ultraviolet spectrum through the carrier and the lift-off layer material, causing the gate electrode to shadow the photoresist;

h) developing the photoresist;

i) removing the photoresist except in the region where the gate electrode shadowed the photoresist;

j) etching away the lift-off layer, except beneath the remaining photoresist, so as to leave a cap beneath the remaining photoresist;

k) etching away the layer of dielectric, except beneath the cap, so as to leave an island beneath said cap;

l) applying a layer of N+ silicon on said layer of amorphous silicon and said cap, said N+ silicon layer being discontinuous at said cap;

m) applying a layer of SD metal upon the N+ silicon, said SD metal being discontinuous at the edge of said cap; and n) etching away said cap so as to cause the N+ silicon and SD metal upon the cap to lift off.

\* \* \* \* \*